US010394523B2

(12) United States Patent
Bhandary

(10) Patent No.: US 10,394,523 B2
(45) Date of Patent: Aug. 27, 2019

(54) METHOD AND SYSTEM FOR EXTRACTING RULE SPECIFIC DATA FROM A COMPUTER WORD

(71) Applicant: Avanseus Holdings Pte. Ltd., Singapore (SG)

(72) Inventor: Chiranjib Bhandary, Bangalore (IN)

(73) Assignee: Avanseus Holdings Pte. Ltd., Singapore (SG)

( * ) Notice: Subject to any disclaimer, the term of this patent is extended or adjusted under 35 U.S.C. 154(b) by 876 days.

(21) Appl. No.: 15/015,160

(22) Filed: Feb. 4, 2016

(65) Prior Publication Data

US 2017/0109632 A1 Apr. 20, 2017

(51) Int. Cl.
*G06F 7/00* (2006.01)
*H03M 7/00* (2006.01)
*H03M 7/30* (2006.01)

(52) U.S. Cl.
CPC ................ *G06F 7/00* (2013.01); *H03M 7/00* (2013.01); *H03M 7/3066* (2013.01)

(58) Field of Classification Search
None
See application file for complete search history.

(56) References Cited

U.S. PATENT DOCUMENTS 5,682,158 A * 10/1997 Edberg ...................... G06F 3/00 341/106
7,116,663 B2 * 10/2006 Liao ........................ H04L 45/00 370/392
8,134,566 B1 * 3/2012 Brown .................... G06T 15/04 345/501
2002/0114451 A1 * 8/2002 Satterfield ............ H04L 9/0618 380/37
2008/0304667 A1 * 12/2008 Mihaljevic ............. G06F 7/582 380/268
2013/0028334 A1 * 1/2013 Bossen .............. H03M 7/4018 375/240.25

* cited by examiner

*Primary Examiner* — Michael D. Yaary
(74) *Attorney, Agent, or Firm* — Renner, Otto, Boisselle & Sklar, LLP

(57) ABSTRACT

The invention provides method and system for extracting rule specific data from a computer word. The method comprises: calculating at least one decimal value based on a rule representation associated with a rule, the rule representation is a byte array, value of each bit of the byte array representing whether a corresponding bit position in the computer word has a data component; identifying at least one result byte array based on the calculated decimal value from a preset look-up table, which includes a plurality of mappings, each between a result byte array and a decimal value, the result byte array indicating a set of reference bit positions for determining a set of bit positions in the computer word in which data components related to the rule are stored, and a last byte of the result byte array representing a bit count value associated with the set of reference bit positions.

21 Claims, 13 Drawing Sheets

| Rule Representation | Byte Count Value | Decimal Value |
|---|---|---|
| 10000000 | 1st byte(1st to 8th bit) | 1 |
| 01000000 | 2nd byte(9th to 16th bit) | 2 |
| 11011000 | 3rd byte (17th to 24th bit) | 27 |
| 00000000 | 4th byte (25th to 32th bit) | 0 |
| 00000000 | 5th byte (33th to 40th bit) | 0 |
| 00000000 | 6th byte (41th to 48th bit) | 0 |
| 00000000 | 7th byte (49th to 56th bit) | 0 |
| 00101000 | 8th byte (57th to 64th bit) | 20 |

| Source byte content | Result byte array |
|---|---|
| 1 | { 0x1, 0x0, 0x0, 0x0, 0x0, 0x0, 0x0, 0x1 } |
| 2 | { 0x2, 0x0, 0x0, 0x0, 0x0, 0x0, 0x0, 0x1 } |
| 3 | { 0x1, 0x2, 0x0, 0x0, 0x0, 0x0, 0x0, 0x2 } |
| 4 | { 0x3, 0x0, 0x0, 0x0, 0x0, 0x0, 0x0, 0x1 } |
| 5 | { 0x1, 0x3, 0x0, 0x0, 0x0, 0x0, 0x0, 0x2 } |
| 6 | { 0x2, 0x3, 0x0, 0x0, 0x0, 0x0, 0x0, 0x2 } |
| 7 | { 0x1, 0x2, 0x3, 0x0, 0x0, 0x0, 0x0, 0x3 } |
| 8 | { 0x4, 0x0, 0x0, 0x0, 0x0, 0x0, 0x0, 0x1 } |
| 9 | { 0x1, 0x4, 0x0, 0x0, 0x0, 0x0, 0x0, 0x2 } |
| 10 | { 0x2, 0x4, 0x0, 0x0, 0x0, 0x0, 0x0, 0x2 } |
| 11 | { 0x1, 0x2, 0x4, 0x0, 0x0, 0x0, 0x0, 0x3 } |
| 12 | { 0x3, 0x4, 0x0, 0x0, 0x0, 0x0, 0x0, 0x2 } |
| 13 | { 0x1, 0x3, 0x4, 0x0, 0x0, 0x0, 0x0, 0x3 } |
| 14 | { 0x2, 0x3, 0x4, 0x0, 0x0, 0x0, 0x0, 0x3 } |
| 15 | { 0x1, 0x2, 0x3, 0x4, 0x0, 0x0, 0x0, 0x4 } |
| 16 | { 0x5, 0x0, 0x0, 0x0, 0x0, 0x0, 0x0, 0x1 } |
| 17 | { 0x1, 0x5, 0x0, 0x0, 0x0, 0x0, 0x0, 0x2 } |
| 18 | { 0x2, 0x5, 0x0, 0x0, 0x0, 0x0, 0x0, 0x2 } |
| 19 | { 0x1, 0x2, 0x5, 0x0, 0x0, 0x0, 0x0, 0x3 } |
| 20 | { 0x3, 0x5, 0x0, 0x0, 0x0, 0x0, 0x0, 0x2 } |
| 21 | { 0x1, 0x3, 0x5, 0x0, 0x0, 0x0, 0x0, 0x3 } |
| 22 | { 0x2, 0x3, 0x5, 0x0, 0x0, 0x0, 0x0, 0x3 } |
| 23 | { 0x1, 0x2, 0x3, 0x5, 0x0, 0x0, 0x0, 0x4 } |
| 24 | { 0x4, 0x5, 0x0, 0x0, 0x0, 0x0, 0x0, 0x2 } |
| 25 | { 0x1, 0x4, 0x5, 0x0, 0x0, 0x0, 0x0, 0x3 } |
| 26 | { 0x2, 0x4, 0x5, 0x0, 0x0, 0x0, 0x0, 0x3 } |
| 27 | { 0x1, 0x2, 0x4, 0x5, 0x0, 0x0, 0x0, 0x4 } |
| 28 | { 0x3, 0x4, 0x5, 0x0, 0x0, 0x0, 0x0, 0x3 } |
| 29 | { 0x1, 0x3, 0x4, 0x5, 0x0, 0x0, 0x0, 0x4 } |
| 30 | { 0x2, 0x3, 0x4, 0x5, 0x0, 0x0, 0x0, 0x4 } |
| 31 | { 0x1, 0x2, 0x3, 0x4, 0x5, 0x0, 0x0, 0x5 } |
| 32 | { 0x6, 0x0, 0x0, 0x0, 0x0, 0x0, 0x0, 0x1 } |
| 33 | { 0x1, 0x6, 0x0, 0x0, 0x0, 0x0, 0x0, 0x2 } |
| 34 | { 0x2, 0x6, 0x0, 0x0, 0x0, 0x0, 0x0, 0x2 } |
| 35 | { 0x1, 0x2, 0x6, 0x0, 0x0, 0x0, 0x0, 0x3 } |
| 36 | { 0x3, 0x6, 0x0, 0x0, 0x0, 0x0, 0x0, 0x2 } |

Figure 2(c)

| | |
|---|---|
| 37 | { 0x1, 0x3, 0x6, 0x0, 0x0, 0x0, 0x0, 0x3 } |
| 38 | { 0x2, 0x3, 0x6, 0x0, 0x0, 0x0, 0x0, 0x3 } |
| 39 | { 0x1, 0x2, 0x3, 0x6, 0x0, 0x0, 0x0, 0x4 } |
| 40 | { 0x4, 0x6, 0x0, 0x0, 0x0, 0x0, 0x0, 0x2 } |
| 41 | { 0x1, 0x4, 0x6, 0x0, 0x0, 0x0, 0x0, 0x3 } |
| 42 | { 0x2, 0x4, 0x6, 0x0, 0x0, 0x0, 0x0, 0x3 } |
| 43 | { 0x1, 0x2, 0x4, 0x6, 0x0, 0x0, 0x0, 0x4 } |
| 44 | { 0x3, 0x4, 0x6, 0x0, 0x0, 0x0, 0x0, 0x3 } |
| 45 | { 0x1, 0x3, 0x4, 0x6, 0x0, 0x0, 0x0, 0x4 } |
| 46 | { 0x2, 0x3, 0x4, 0x6, 0x0, 0x0, 0x0, 0x4 } |
| 47 | { 0x1, 0x2, 0x3, 0x4, 0x6, 0x0, 0x0, 0x5 } |
| 48 | { 0x5, 0x6, 0x0, 0x0, 0x0, 0x0, 0x0, 0x2 } |
| 49 | { 0x1, 0x5, 0x6, 0x0, 0x0, 0x0, 0x0, 0x3 } |
| 50 | { 0x2, 0x5, 0x6, 0x0, 0x0, 0x0, 0x0, 0x3 } |
| 51 | { 0x1, 0x2, 0x5, 0x6, 0x0, 0x0, 0x0, 0x4 } |
| 52 | { 0x3, 0x5, 0x6, 0x0, 0x0, 0x0, 0x0, 0x3 } |
| 53 | { 0x1, 0x3, 0x5, 0x6, 0x0, 0x0, 0x0, 0x4 } |
| 54 | { 0x2, 0x3, 0x5, 0x6, 0x0, 0x0, 0x0, 0x4 } |
| 55 | { 0x1, 0x2, 0x3, 0x5, 0x6, 0x0, 0x0, 0x5 } |
| 56 | { 0x4, 0x5, 0x6, 0x0, 0x0, 0x0, 0x0, 0x3 } |
| 57 | { 0x1, 0x4, 0x5, 0x6, 0x0, 0x0, 0x0, 0x4 } |
| 58 | { 0x2, 0x4, 0x5, 0x6, 0x0, 0x0, 0x0, 0x4 } |
| 59 | { 0x1, 0x2, 0x4, 0x5, 0x6, 0x0, 0x0, 0x5 } |
| 60 | { 0x3, 0x4, 0x5, 0x6, 0x0, 0x0, 0x0, 0x4 } |
| 61 | { 0x1, 0x3, 0x4, 0x5, 0x6, 0x0, 0x0, 0x5 } |
| 62 | { 0x2, 0x3, 0x4, 0x5, 0x6, 0x0, 0x0, 0x5 } |
| 63 | { 0x1, 0x2, 0x3, 0x4, 0x5, 0x6, 0x0, 0x6 } |
| 64 | { 0x7, 0x0, 0x0, 0x0, 0x0, 0x0, 0x0, 0x1 } |
| 65 | { 0x1, 0x7, 0x0, 0x0, 0x0, 0x0, 0x0, 0x2 } |
| 66 | { 0x2, 0x7, 0x0, 0x0, 0x0, 0x0, 0x0, 0x2 } |
| 67 | { 0x1, 0x2, 0x7, 0x0, 0x0, 0x0, 0x0, 0x3 } |
| 68 | { 0x3, 0x7, 0x0, 0x0, 0x0, 0x0, 0x0, 0x2 } |
| 69 | { 0x1, 0x3, 0x7, 0x0, 0x0, 0x0, 0x0, 0x3 } |
| 70 | { 0x2, 0x3, 0x7, 0x0, 0x0, 0x0, 0x0, 0x3 } |
| 71 | { 0x1, 0x2, 0x3, 0x7, 0x0, 0x0, 0x0, 0x4 } |
| 72 | { 0x4, 0x7, 0x0, 0x0, 0x0, 0x0, 0x0, 0x2 } |
| 73 | { 0x1, 0x4, 0x7, 0x0, 0x0, 0x0, 0x0, 0x3 } |
| 74 | { 0x2, 0x4, 0x7, 0x0, 0x0, 0x0, 0x0, 0x3 } |
| 75 | { 0x1, 0x2, 0x4, 0x7, 0x0, 0x0, 0x0, 0x4 } |
| 76 | { 0x3, 0x4, 0x7, 0x0, 0x0, 0x0, 0x0, 0x3 } |
| 77 | { 0x1, 0x3, 0x4, 0x7, 0x0, 0x0, 0x0, 0x4 } |

Figure 2(c)
*(continued)*

| | |
|---|---|
| 78 | { 0x2, 0x3, 0x4, 0x7, 0x0, 0x0, 0x0, 0x4 } |
| 79 | { 0x1, 0x2, 0x3, 0x4, 0x7, 0x0, 0x0, 0x5 } |
| 80 | { 0x5, 0x7, 0x0, 0x0, 0x0, 0x0, 0x0, 0x2 } |
| 81 | { 0x1, 0x5, 0x7, 0x0, 0x0, 0x0, 0x0, 0x3 } |
| 82 | { 0x2, 0x5, 0x7, 0x0, 0x0, 0x0, 0x0, 0x3 } |
| 83 | { 0x1, 0x2, 0x5, 0x7, 0x0, 0x0, 0x0, 0x4 } |
| 84 | { 0x3, 0x5, 0x7, 0x0, 0x0, 0x0, 0x0, 0x3 } |
| 85 | { 0x1, 0x3, 0x5, 0x7, 0x0, 0x0, 0x0, 0x4 } |
| 86 | { 0x2, 0x3, 0x5, 0x7, 0x0, 0x0, 0x0, 0x4 } |
| 87 | { 0x1, 0x2, 0x3, 0x5, 0x7, 0x0, 0x0, 0x5 } |
| 88 | { 0x4, 0x5, 0x7, 0x0, 0x0, 0x0, 0x0, 0x3 } |
| 89 | { 0x1, 0x4, 0x5, 0x7, 0x0, 0x0, 0x0, 0x4 } |
| 90 | { 0x2, 0x4, 0x5, 0x7, 0x0, 0x0, 0x0, 0x4 } |
| 91 | { 0x1, 0x2, 0x4, 0x5, 0x7, 0x0, 0x0, 0x5 } |
| 92 | { 0x3, 0x4, 0x5, 0x7, 0x0, 0x0, 0x0, 0x4 } |
| 93 | { 0x1, 0x3, 0x4, 0x5, 0x7, 0x0, 0x0, 0x5 } |
| 94 | { 0x2, 0x3, 0x4, 0x5, 0x7, 0x0, 0x0, 0x5 } |
| 95 | { 0x1, 0x2, 0x3, 0x4, 0x5, 0x7, 0x0, 0x6 } |
| 96 | { 0x6, 0x7, 0x0, 0x0, 0x0, 0x0, 0x0, 0x2 } |
| 97 | { 0x1, 0x6, 0x7, 0x0, 0x0, 0x0, 0x0, 0x3 } |
| 98 | { 0x2, 0x6, 0x7, 0x0, 0x0, 0x0, 0x0, 0x3 } |
| 99 | { 0x1, 0x2, 0x6, 0x7, 0x0, 0x0, 0x0, 0x4 } |
| 100 | { 0x3, 0x6, 0x7, 0x0, 0x0, 0x0, 0x0, 0x3 } |
| 101 | { 0x1, 0x3, 0x6, 0x7, 0x0, 0x0, 0x0, 0x4 } |
| 102 | { 0x2, 0x3, 0x6, 0x7, 0x0, 0x0, 0x0, 0x4 } |
| 103 | { 0x1, 0x2, 0x3, 0x6, 0x7, 0x0, 0x0, 0x5 } |
| 104 | { 0x4, 0x6, 0x7, 0x0, 0x0, 0x0, 0x0, 0x3 } |
| 105 | { 0x1, 0x4, 0x6, 0x7, 0x0, 0x0, 0x0, 0x4 } |
| 106 | { 0x2, 0x4, 0x6, 0x7, 0x0, 0x0, 0x0, 0x4 } |
| 107 | { 0x1, 0x2, 0x4, 0x6, 0x7, 0x0, 0x0, 0x5 } |
| 108 | { 0x3, 0x4, 0x6, 0x7, 0x0, 0x0, 0x0, 0x4 } |
| 109 | { 0x1, 0x3, 0x4, 0x6, 0x7, 0x0, 0x0, 0x5 } |
| 110 | { 0x2, 0x3, 0x4, 0x6, 0x7, 0x0, 0x0, 0x5 } |
| 111 | { 0x1, 0x2, 0x3, 0x4, 0x6, 0x7, 0x0, 0x6 } |
| 112 | { 0x5, 0x6, 0x7, 0x0, 0x0, 0x0, 0x0, 0x3 } |
| 113 | { 0x1, 0x5, 0x6, 0x7, 0x0, 0x0, 0x0, 0x4 } |
| 114 | { 0x2, 0x5, 0x6, 0x7, 0x0, 0x0, 0x0, 0x4 } |
| 115 | { 0x1, 0x2, 0x5, 0x6, 0x7, 0x0, 0x0, 0x5 } |
| 116 | { 0x3, 0x5, 0x6, 0x7, 0x0, 0x0, 0x0, 0x4 } |
| 117 | { 0x1, 0x3, 0x5, 0x6, 0x7, 0x0, 0x0, 0x5 } |
| 118 | { 0x2, 0x3, 0x5, 0x6, 0x7, 0x0, 0x0, 0x5 } |

Figure 2(c)
*(continued)*

| | |
|---|---|
| 119 | { 0x1, 0x2, 0x3, 0x5, 0x6, 0x7, 0x0, 0x6 } |
| 120 | { 0x4, 0x5, 0x6, 0x7, 0x0, 0x0, 0x0, 0x4 } |
| 121 | { 0x1, 0x4, 0x5, 0x6, 0x7, 0x0, 0x0, 0x5 } |
| 122 | { 0x2, 0x4, 0x5, 0x6, 0x7, 0x0, 0x0, 0x5 } |
| 123 | { 0x1, 0x2, 0x4, 0x5, 0x6, 0x7, 0x0, 0x6 } |
| 124 | { 0x3, 0x4, 0x5, 0x6, 0x7, 0x0, 0x0, 0x5 } |
| 125 | { 0x1, 0x3, 0x4, 0x5, 0x6, 0x7, 0x0, 0x6 } |
| 126 | { 0x2, 0x3, 0x4, 0x5, 0x6, 0x7, 0x0, 0x6 } |
| 127 | { 0x1, 0x2, 0x3, 0x4, 0x5, 0x6, 0x7, 0x7 } |
| 128 | { 0x8, 0x0, 0x0, 0x0, 0x0, 0x0, 0x0, 0x1 } |
| 129 | { 0x1, 0x8, 0x0, 0x0, 0x0, 0x0, 0x0, 0x2 } |
| 130 | { 0x2, 0x8, 0x0, 0x0, 0x0, 0x0, 0x0, 0x2 } |
| 131 | { 0x1, 0x2, 0x8, 0x0, 0x0, 0x0, 0x0, 0x3 } |
| 132 | { 0x3, 0x8, 0x0, 0x0, 0x0, 0x0, 0x0, 0x2 } |
| 133 | { 0x1, 0x3, 0x8, 0x0, 0x0, 0x0, 0x0, 0x3 } |
| 134 | { 0x2, 0x3, 0x8, 0x0, 0x0, 0x0, 0x0, 0x3 } |
| 135 | { 0x1, 0x2, 0x3, 0x8, 0x0, 0x0, 0x0, 0x4 } |
| 136 | { 0x4, 0x8, 0x0, 0x0, 0x0, 0x0, 0x0, 0x2 } |
| 137 | { 0x1, 0x4, 0x8, 0x0, 0x0, 0x0, 0x0, 0x3 } |
| 138 | { 0x2, 0x4, 0x8, 0x0, 0x0, 0x0, 0x0, 0x3 } |
| 139 | { 0x1, 0x2, 0x4, 0x8, 0x0, 0x0, 0x0, 0x4 } |
| 140 | { 0x3, 0x4, 0x8, 0x0, 0x0, 0x0, 0x0, 0x3 } |
| 141 | { 0x1, 0x3, 0x4, 0x8, 0x0, 0x0, 0x0, 0x4 } |
| 142 | { 0x2, 0x3, 0x4, 0x8, 0x0, 0x0, 0x0, 0x4 } |
| 143 | { 0x1, 0x2, 0x3, 0x4, 0x8, 0x0, 0x0, 0x5 } |
| 144 | { 0x5, 0x8, 0x0, 0x0, 0x0, 0x0, 0x0, 0x2 } |
| 145 | { 0x1, 0x5, 0x8, 0x0, 0x0, 0x0, 0x0, 0x3 } |
| 146 | { 0x2, 0x5, 0x8, 0x0, 0x0, 0x0, 0x0, 0x3 } |
| 147 | { 0x1, 0x2, 0x5, 0x8, 0x0, 0x0, 0x0, 0x4 } |
| 148 | { 0x3, 0x5, 0x8, 0x0, 0x0, 0x0, 0x0, 0x3 } |
| 149 | { 0x1, 0x3, 0x5, 0x8, 0x0, 0x0, 0x0, 0x4 } |
| 150 | { 0x2, 0x3, 0x5, 0x8, 0x0, 0x0, 0x0, 0x4 } |
| 151 | { 0x1, 0x2, 0x3, 0x5, 0x8, 0x0, 0x0, 0x5 } |
| 152 | { 0x4, 0x5, 0x8, 0x0, 0x0, 0x0, 0x0, 0x3 } |
| 153 | { 0x1, 0x4, 0x5, 0x8, 0x0, 0x0, 0x0, 0x4 } |
| 154 | { 0x2, 0x4, 0x5, 0x8, 0x0, 0x0, 0x0, 0x4 } |
| 155 | { 0x1, 0x2, 0x4, 0x5, 0x8, 0x0, 0x0, 0x5 } |
| 156 | { 0x3, 0x4, 0x5, 0x8, 0x0, 0x0, 0x0, 0x4 } |
| 157 | { 0x1, 0x3, 0x4, 0x5, 0x8, 0x0, 0x0, 0x5 } |
| 158 | { 0x2, 0x3, 0x4, 0x5, 0x8, 0x0, 0x0, 0x5 } |
| 159 | { 0x1, 0x2, 0x3, 0x4, 0x5, 0x8, 0x0, 0x6 } |

Figure 2 (c)
*(continued)*

| | |
|---|---|
| 160 | { 0x6, 0x8, 0x0, 0x0, 0x0, 0x0, 0x0, 0x2 } |
| 161 | { 0x1, 0x6, 0x8, 0x0, 0x0, 0x0, 0x0, 0x3 } |
| 162 | { 0x2, 0x6, 0x8, 0x0, 0x0, 0x0, 0x0, 0x3 } |
| 163 | { 0x1, 0x2, 0x6, 0x8, 0x0, 0x0, 0x0, 0x4 } |
| 164 | { 0x3, 0x6, 0x8, 0x0, 0x0, 0x0, 0x0, 0x3 } |
| 165 | { 0x1, 0x3, 0x6, 0x8, 0x0, 0x0, 0x0, 0x4 } |
| 166 | { 0x2, 0x3, 0x6, 0x8, 0x0, 0x0, 0x0, 0x4 } |
| 167 | { 0x1, 0x2, 0x3, 0x6, 0x8, 0x0, 0x0, 0x5 } |
| 168 | { 0x4, 0x6, 0x8, 0x0, 0x0, 0x0, 0x0, 0x3 } |
| 169 | { 0x1, 0x4, 0x6, 0x8, 0x0, 0x0, 0x0, 0x4 } |
| 170 | { 0x2, 0x4, 0x6, 0x8, 0x0, 0x0, 0x0, 0x4 } |
| 171 | { 0x1, 0x2, 0x4, 0x6, 0x8, 0x0, 0x0, 0x5 } |
| 172 | { 0x3, 0x4, 0x6, 0x8, 0x0, 0x0, 0x0, 0x4 } |
| 173 | { 0x1, 0x3, 0x4, 0x6, 0x8, 0x0, 0x0, 0x5 } |
| 174 | { 0x2, 0x3, 0x4, 0x6, 0x8, 0x0, 0x0, 0x5 } |
| 175 | { 0x1, 0x2, 0x3, 0x4, 0x6, 0x8, 0x0, 0x6 } |
| 176 | { 0x5, 0x6, 0x8, 0x0, 0x0, 0x0, 0x0, 0x3 } |
| 177 | { 0x1, 0x5, 0x6, 0x8, 0x0, 0x0, 0x0, 0x4 } |
| 178 | { 0x2, 0x5, 0x6, 0x8, 0x0, 0x0, 0x0, 0x4 } |
| 179 | { 0x1, 0x2, 0x5, 0x6, 0x8, 0x0, 0x0, 0x5 } |
| 180 | { 0x3, 0x5, 0x6, 0x8, 0x0, 0x0, 0x0, 0x4 } |
| 181 | { 0x1, 0x3, 0x5, 0x6, 0x8, 0x0, 0x0, 0x5 } |
| 182 | { 0x2, 0x3, 0x5, 0x6, 0x8, 0x0, 0x0, 0x5 } |
| 183 | { 0x1, 0x2, 0x3, 0x5, 0x6, 0x8, 0x0, 0x6 } |
| 184 | { 0x4, 0x5, 0x6, 0x8, 0x0, 0x0, 0x0, 0x4 } |
| 185 | { 0x1, 0x4, 0x5, 0x6, 0x8, 0x0, 0x0, 0x5 } |
| 186 | { 0x2, 0x4, 0x5, 0x6, 0x8, 0x0, 0x0, 0x5 } |
| 187 | { 0x1, 0x2, 0x4, 0x5, 0x6, 0x8, 0x0, 0x6 } |
| 188 | { 0x3, 0x4, 0x5, 0x6, 0x8, 0x0, 0x0, 0x5 } |
| 189 | { 0x1, 0x3, 0x4, 0x5, 0x6, 0x8, 0x0, 0x6 } |
| 190 | { 0x2, 0x3, 0x4, 0x5, 0x6, 0x8, 0x0, 0x6 } |
| 191 | { 0x1, 0x2, 0x3, 0x4, 0x5, 0x6, 0x8, 0x7 } |
| 192 | { 0x7, 0x8, 0x0, 0x0, 0x0, 0x0, 0x0, 0x2 } |
| 193 | { 0x1, 0x7, 0x8, 0x0, 0x0, 0x0, 0x0, 0x3 } |
| 194 | { 0x2, 0x7, 0x8, 0x0, 0x0, 0x0, 0x0, 0x3 } |
| 195 | { 0x1, 0x2, 0x7, 0x8, 0x0, 0x0, 0x0, 0x4 } |
| 196 | { 0x3, 0x7, 0x8, 0x0, 0x0, 0x0, 0x0, 0x3 } |
| 197 | { 0x1, 0x3, 0x7, 0x8, 0x0, 0x0, 0x0, 0x4 } |
| 198 | { 0x2, 0x3, 0x7, 0x8, 0x0, 0x0, 0x0, 0x4 } |
| 199 | { 0x1, 0x2, 0x3, 0x7, 0x8, 0x0, 0x0, 0x5 } |
| 200 | { 0x4, 0x7, 0x8, 0x0, 0x0, 0x0, 0x0, 0x3 } |

Figure 2(c)
*(continued)*

| | |
|---|---|
| 201 | { 0x1, 0x4, 0x7, 0x8, 0x0, 0x0, 0x0, 0x4 } |
| 202 | { 0x2, 0x4, 0x7, 0x8, 0x0, 0x0, 0x0, 0x4 } |
| 203 | { 0x1, 0x2, 0x4, 0x7, 0x8, 0x0, 0x0, 0x5 } |
| 204 | { 0x3, 0x4, 0x7, 0x8, 0x0, 0x0, 0x0, 0x4 } |
| 205 | { 0x1, 0x3, 0x4, 0x7, 0x8, 0x0, 0x0, 0x5 } |
| 206 | { 0x2, 0x3, 0x4, 0x7, 0x8, 0x0, 0x0, 0x5 } |
| 207 | { 0x1, 0x2, 0x3, 0x4, 0x7, 0x8, 0x0, 0x6 } |
| 208 | { 0x5, 0x7, 0x8, 0x0, 0x0, 0x0, 0x0, 0x3 } |
| 209 | { 0x1, 0x5, 0x7, 0x8, 0x0, 0x0, 0x0, 0x4 } |
| 210 | { 0x2, 0x5, 0x7, 0x8, 0x0, 0x0, 0x0, 0x4 } |
| 211 | { 0x1, 0x2, 0x5, 0x7, 0x8, 0x0, 0x0, 0x5 } |
| 212 | { 0x3, 0x5, 0x7, 0x8, 0x0, 0x0, 0x0, 0x4 } |
| 213 | { 0x1, 0x3, 0x5, 0x7, 0x8, 0x0, 0x0, 0x5 } |
| 214 | { 0x2, 0x3, 0x5, 0x7, 0x8, 0x0, 0x0, 0x5 } |
| 215 | { 0x1, 0x2, 0x3, 0x5, 0x7, 0x8, 0x0, 0x6 } |
| 216 | { 0x4, 0x5, 0x7, 0x8, 0x0, 0x0, 0x0, 0x4 } |
| 217 | { 0x1, 0x4, 0x5, 0x7, 0x8, 0x0, 0x0, 0x5 } |
| 218 | { 0x2, 0x4, 0x5, 0x7, 0x8, 0x0, 0x0, 0x5 } |
| 219 | { 0x1, 0x2, 0x4, 0x5, 0x7, 0x8, 0x0, 0x6 } |
| 220 | { 0x3, 0x4, 0x5, 0x7, 0x8, 0x0, 0x0, 0x5 } |
| 221 | { 0x1, 0x3, 0x4, 0x5, 0x7, 0x8, 0x0, 0x6 } |
| 222 | { 0x2, 0x3, 0x4, 0x5, 0x7, 0x8, 0x0, 0x6 } |
| 223 | { 0x1, 0x2, 0x3, 0x4, 0x5, 0x7, 0x8, 0x7 } |
| 224 | { 0x6, 0x7, 0x8, 0x0, 0x0, 0x0, 0x0, 0x3 } |
| 225 | { 0x1, 0x6, 0x7, 0x8, 0x0, 0x0, 0x0, 0x4 } |
| 226 | { 0x2, 0x6, 0x7, 0x8, 0x0, 0x0, 0x0, 0x4 } |
| 227 | { 0x1, 0x2, 0x6, 0x7, 0x8, 0x0, 0x0, 0x5 } |
| 228 | { 0x3, 0x6, 0x7, 0x8, 0x0, 0x0, 0x0, 0x4 } |
| 229 | { 0x1, 0x3, 0x6, 0x7, 0x8, 0x0, 0x0, 0x5 } |
| 230 | { 0x2, 0x3, 0x6, 0x7, 0x8, 0x0, 0x0, 0x5 } |
| 231 | { 0x1, 0x2, 0x3, 0x6, 0x7, 0x8, 0x0, 0x6 } |
| 232 | { 0x4, 0x6, 0x7, 0x8, 0x0, 0x0, 0x0, 0x4 } |
| 233 | { 0x1, 0x4, 0x6, 0x7, 0x8, 0x0, 0x0, 0x5 } |
| 234 | { 0x2, 0x4, 0x6, 0x7, 0x8, 0x0, 0x0, 0x5 } |
| 235 | { 0x1, 0x2, 0x4, 0x6, 0x7, 0x8, 0x0, 0x6 } |
| 236 | { 0x3, 0x4, 0x6, 0x7, 0x8, 0x0, 0x0, 0x5 } |
| 237 | { 0x1, 0x3, 0x4, 0x6, 0x7, 0x8, 0x0, 0x6 } |
| 238 | { 0x2, 0x3, 0x4, 0x6, 0x7, 0x8, 0x0, 0x6 } |
| 239 | { 0x1, 0x2, 0x3, 0x4, 0x6, 0x7, 0x8, 0x7 } |
| 240 | { 0x5, 0x6, 0x7, 0x8, 0x0, 0x0, 0x0, 0x4 } |
| 241 | { 0x1, 0x5, 0x6, 0x7, 0x8, 0x0, 0x0, 0x5 } |

Figure 2(c)
*(continued)*

| | |
|---|---|
| 242 | { 0x2, 0x5, 0x6, 0x7, 0x8, 0x0, 0x0, 0x5 } |
| 243 | { 0x1, 0x2, 0x5, 0x6, 0x7, 0x8, 0x0, 0x6 } |
| 244 | { 0x3, 0x5, 0x6, 0x7, 0x8, 0x0, 0x0, 0x5 } |
| 245 | { 0x1, 0x3, 0x5, 0x6, 0x7, 0x8, 0x0, 0x6 } |
| 246 | { 0x2, 0x3, 0x5, 0x6, 0x7, 0x8, 0x0, 0x6 } |
| 247 | { 0x1, 0x2, 0x3, 0x5, 0x6, 0x7, 0x8, 0x7 } |
| 248 | { 0x4, 0x5, 0x6, 0x7, 0x8, 0x0, 0x0, 0x5 } |
| 249 | { 0x1, 0x4, 0x5, 0x6, 0x7, 0x8, 0x0, 0x6 } |
| 250 | { 0x2, 0x4, 0x5, 0x6, 0x7, 0x8, 0x0, 0x6 } |
| 251 | { 0x1, 0x2, 0x4, 0x5, 0x6, 0x7, 0x8, 0x7 } |
| 252 | { 0x3, 0x4, 0x5, 0x6, 0x7, 0x8, 0x0, 0x6 } |
| 253 | { 0x1, 0x3, 0x4, 0x5, 0x6, 0x7, 0x8, 0x7 } |
| 254 | { 0x2, 0x3, 0x4, 0x5, 0x6, 0x7, 0x8, 0x7 } |
| 255 | { 0x1, 0x2, 0x3, 0x4, 0x5, 0x6, 0x7, 0x8 } |

Figure 2(c)
*(continued)*

| Number of Set Bit Positions | Time taken in milliseconds for 1 Million 64-bit words | | |
|---|---|---|---|
| | Current Invention | Rightmost Bit Extraction | Simple Scan |
| 1 | 53 | 31 | 136 |
| 2 | 64 | 50 | 137 |
| 3 | 64 | 69 | 160 |
| 4 | 74 | 87 | 163 |
| 5 | 56 | 108 | 160 |
| 6 | 78 | 129 | 162 |
| 7 | 61 | 149 | 162 |
| 8 | 84 | 166 | 162 |
| 9 | 68 | 187 | 160 |
| 10 | 64 | 205 | 160 |
| 11 | 87 | 239 | 160 |
| 12 | 82 | 256 | 161 |
| 13 | 70 | 266 | 160 |
| 14 | 90 | 291 | 160 |
| 15 | 75 | 321 | 160 |
| 16 | 108 | 341 | 161 |
| 17 | 92 | 342 | 161 |
| 18 | 80 | 385 | 168 |
| 19 | 98 | 381 | 161 |
| 20 | 116 | 425 | 161 |
| 21 | 141 | 432 | 161 |
| 22 | 102 | 453 | 160 |
| 23 | 128 | 460 | 192 |
| 24 | 162 | 492 | 161 |
| 25 | 162 | 537 | 162 |
| 26 | 147 | 551 | 162 |
| 27 | 144 | 570 | 161 |
| 28 | 166 | 577 | 161 |
| 29 | 143 | 628 | 160 |
| 30 | 133 | 605 | 161 |
| 31 | 182 | 656 | 161 |
| 32 | 147 | 691 | 162 |

Figure 3

| Number of Set Bit Positions | Time taken in milliseconds for 1 Million 64-bit words | | |
|---|---|---|---|
| | Present Invention | Rightmost Bit Extraction | Simple Scan |
| 33 | 179 | 673 | 161 |
| 34 | 174 | 718 | 160 |
| 35 | 169 | 755 | 160 |
| 36 | 150 | 787 | 162 |
| 37 | 157 | 772 | 161 |
| 38 | 171 | 795 | 160 |
| 39 | 166 | 838 | 161 |
| 40 | 172 | 829 | 161 |
| 41 | 164 | 874 | 161 |
| 42 | 188 | 894 | 161 |
| 43 | 168 | 936 | 163 |
| 44 | 156 | 918 | 161 |
| 45 | 168 | 1041 | 160 |
| 46 | 170 | 997 | 161 |
| 47 | 188 | 1009 | 161 |
| 48 | 195 | 1085 | 160 |
| 49 | 184 | 1085 | 161 |
| 50 | 183 | 1116 | 170 |
| 51 | 190 | 1087 | 161 |
| 52 | 168 | 1225 | 160 |
| 53 | 211 | 1226 | 161 |
| 54 | 195 | 1208 | 160 |
| 55 | 194 | 1163 | 161 |
| 56 | 215 | 1237 | 160 |
| 57 | 200 | 1194 | 161 |
| 58 | 204 | 1265 | 161 |
| 59 | 183 | 1236 | 160 |
| 60 | 191 | 1309 | 160 |
| 61 | 176 | 1380 | 161 |
| 62 | 185 | 1344 | 161 |
| 63 | 170 | 1364 | 161 |
| 64 | 155 | 1364 | 160 |
| Average time | 142 | 700 | 161 |

METHOD AND SYSTEM FOR EXTRACTING RULE SPECIFIC DATA FROM A COMPUTER WORD

FIELD OF INVENTION

The invention relates to a method and system for extracting rule specific data, i.e. data component(s) related to the rule, from a computer word in an efficient way so that the rule can be readily executed.

BACKGROUND

While processing a data stream, typically, it is required to validate, update or filter a record in the data stream based on a subset of data components associated with the record, or initiate an action depending on value of a data component associated with a record, or increment a statistic counters for a valid record. Each record is generally passed through a number of pre-configured rules which are executed when a data stream is processed. There are many types of rules, e.g. one type of rule just contains a set of fields and the corresponding values. Both the fields and the corresponding values are data components of the rule.

In case of processing a high volume data stream with many pre-configured rules, rule execution time is of high importance from throughput perspective. Before a rule is executed, the data components related to the rule have to be extracted from a computer word so that the rule can be subsequently executed.

One existing method for extracting data components related to the rule from a computer word is a simple scan method. This is a simple and compact method. However, this method needs to scan each of a plurality of bits in a rule representation associated with the rule from the computer word regardless of the number of data components related to the rule. That is to say, this method performs same number of loops for extracting data components related to any rule. Therefore, this method is inefficient when there are only a few data components related to the rule to be extracted from the computer word.

Another existing method for extracting data components related to the rule is a rightmost bit extraction method. This method is efficient when there are only a few data components related to the rule in the computer word since it executes a specific number of computer instructions for each data component. However, this method is inefficient when there are many data components related to the rule in a computer word.

SUMMARY OF INVENTION

In order to provide an efficient way for extracting rule specific data from a computer word, embodiments of the invention provide a compact rule representation for each rule and preset a look-up table for efficiently extracting the rule specific data from a computer word stored in a computer system.

According to one aspect of the invention, a method for extracting rule specific data in a computer word is provided. The method comprises:

calculating, by a processor in the computer system, at least one decimal value based on a rule representation associated with a rule, wherein the rule representation is a byte array including at least one byte binary codes, value of each bit of the byte array configured to represent whether a corresponding bit position in the computer word has a data component related to the rule;

identifying, by the processor in the computer system, at least one result byte array corresponding to the rule based on the calculated at least one decimal value from a preset look-up table in the computer system, wherein the preset look-up table includes a plurality of mappings, each mapping between a result byte array and a decimal value, the result byte array in each mapping indicating a set of reference bit positions for determining a set of bit positions in the computer word, wherein a last byte of the result byte array in each mapping is configured to represent a bit count value associated with the set of reference bit positions; and determining, by the processor in the computer system, a set of bit positions in the computer word in which a set of data components related to the rule are stored based on both the set of reference bit positions indicated by each identified result byte array and the last byte of each identified result byte array as a loop counter.

According to another aspect of the invention, a system for extracting rule specific data in a computer word is provided. The system comprises: a processor and a memory communicably coupled thereto, wherein the memory is configured to store data to be executed by the processor, wherein the processor is configured to calculate at least one decimal value based on a rule representation associated with a rule, wherein the rule representation is a byte array including at least one byte binary codes, value of each bit of the byte array configured to represent whether a corresponding bit position in the computer word has a data component related to the rule;

identify at least one result byte array corresponding to the rule based on the calculated at least one decimal value from a preset look-up table stored in the memory, wherein the preset look-up table includes a plurality of mappings, each mapping between a result byte array and a decimal value, the result byte array in each mapping indicating a set of reference bit positions for determining a set of bit positions in the computer word, wherein a last byte of the result byte array in each mapping is configured to represent a bit count value associated with the set of reference bit positions; and determine a set of bit positions in the computer word in which a set of data components related to the rule are stored based on the set of reference bit positions indicated by each identified result byte array and by using the last byte of each identified result byte array as a loop counter.

According to another aspect of the invention, a non-transitory computer readable medium is provided. The medium comprises computer program code for extracting data component related to a rule from a computer word, wherein the computer program code, when executed, is configured to cause a processor in a computer system perform a method for extracting rule specific data in a computer word mentioned above.

BRIEF DESCRIPTION OF THE DRAWINGS

The invention will be described in detail with reference to the accompanying drawings, in which:

FIG. 2(*b*) shows an example of an eight-byte array rule representation associated with a rule and the corresponding decimal value of each byte in the rule representation;

FIG. 2(*c*) shows an example of a preset look-up table;

FIG. 3 shows results of time required for extracting different number of data components from a computer word respectively using the method disclosed in one embodiment of the invention, the existing simple scan method and rightmost bit extraction method;

DETAILED DESCRIPTION OF EMBODIMENTS OF THE INVENTION

Figure 1:
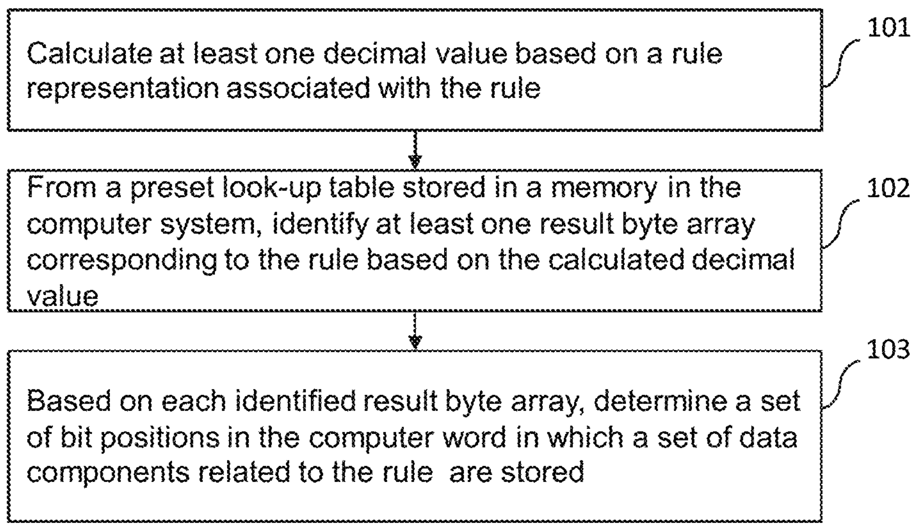
FIG. 1 is a flow chart illustrating a method for extracting rule specific data in a computer word according to a first embodiment of the invention.

In the following description, numerous specific details are set forth in order to provide a thorough understanding of various illustrative embodiments of the invention. It will be understood, however, to one skilled in the art, that embodiments of the invention may be practiced without some or all of these specific details. It is understood that the terminology used herein is for the purpose of describing particular embodiments only, and is not intended to limit the scope of the invention. In the drawings, like reference numerals refer to same or similar functionalities or features throughout the several views.

Embodiments of the invention provide a method for extracting rule specific data for a pre-configured rule from a computer word efficiently. In this method, a set of bit positions in the computer word in which a set of data components related to a rule are stored is identified using a predetermined rule representation associated with the rule and a preset look-up table.

FIG. 1 is a flowchart illustrating the method 100 for extracting rule specific data in a computer word by a computer system according to a first embodiment of the invention.

In block 101, a processor in the computer system calculates at least one decimal value based on a predetermined rule representation associated with the pre-configured rule.

The predetermined rule representation associated with the pre-configured rule is a byte array including at least one byte binary codes. The value of each bit of the byte array is configured to represent whether a corresponding bit position in the computer word has a data component related to the rule, e.g. 0 represents an absence of data component related to the rule in the corresponding bit position; 1 represents a presence of data component related to the rule in the corresponding bit position.

The predetermined rule representation associated with the pre-configured rule may be a one-byte array, if the computer word is an 8-bit computer word.

The predetermined rule representation associated with the pre-configured rule may be a four-byte array, if the computer word is a 32-bit computer word.

The predetermined rule representation associated with the pre-configured rule may be an eight-byte array, if the computer word is a 64-bit computer word.

In block 102, from a preset look-up table stored in a memory in the computer system, the processor in the computer system identifies at least one result byte array corresponding to the rule based on the calculated at least one decimal value.

The preset look-up table includes a plurality of mappings. Each mapping is between a result byte array and a decimal value. The result byte array in each mapping indicates a set of reference bit positions for determining a set of bit positions in the computer word. A last byte of the result byte array in each mapping is configured to represent a bit count value associated with the set of reference bit positions. For example, if the set of reference bit positions indicated by a result byte array includes four reference bit positions, the bit count value is set as 4.

It should be noted that one set of reference bit positions includes at least one reference bit position; one set of bit position includes at least one bit position; one set of data components includes at least one data component.

In block 103, based on each identified result byte array, i.e. the set of reference bit positions indicated by each identified result byte array and the last byte of each identified result byte array which is used as a loop counter, the processor in the computer system determines a set of bit positions in the computer word in which a set of data components related to the rule are stored.

Figures 2A, 2B:
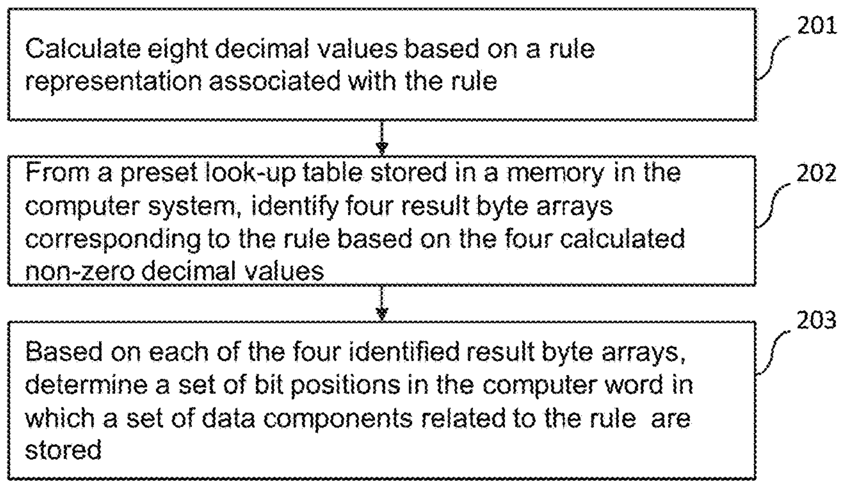
FIG. 2(*a*) is a flow chart illustrating a method for extracting rule specific data in a computer word according to a second embodiment of the invention.

FIG. 2(*a*) is a flowchart illustrating the method 200 for extracting rule specific data in a computer word by a computer system according to a second embodiment of the invention. In this embodiment, the computer word is a 64-bit word. The predetermined rule representation associated with the rule is an eight-byte array including eight bytes, i.e. $1^{st}$ byte to $8^{th}$ byte and each byte includes eight bit of binary codes, as shown in FIG. 2(*b*). Value of each bit of the eight-byte array is configured to represent whether a corresponding bit position in the computer word has a data component related to the rule. In this example, if the bit value is 0, the corresponding bit position in the computer word has no data component related to the rule; if the bit value is 1, the corresponding bit position has a data component related to the rule. As shown in FIG. 2(*b*), in this example, the data components related to the rule in the computer word are stored in the $1^{st}$, $10^{th}$, $17^{th}$, $18^{th}$, $20^{th}$, $21^{th}$, $59^{th}$, and $60^{th}$ bit positions in the 64-bit computer word.

In block 201, a processor in the computer system calculates eight decimal values based on the rule representation associated with the rule shown in FIG. 2(*b*).

Each decimal value is calculated based on one byte of the eight-byte array. The eight decimal values are respectively 1, 2, 27, 0, 0, 0, 0, and 20. There are four non-zero decimal values 1, 2, 27 and 20.

In block 202, from a preset look-up table stored in a memory in the computer system, the processor in the computer system identifies four result byte arrays corresponding to the rule based on the four calculated non-zero decimal values.

FIG. 2(*c*) shows an example of the preset look-up table. This look-up table includes 255 mappings, each mapping between a result byte array and a decimal value from 1 to 255. Each result byte array represents a set of reference bit positions for determining a set of bit positions in the computer word, and the last byte of each result byte array is configured to represent a bit count value associated with the set of reference bit positions indicated by the result byte array. It will be explained in detail below that the set of reference bit positions represented by each result byte array refer to the set of bit positions each having a value set as a predetermined value, e.g. 1, to represent a presence of a data component related to the rule in the corresponding byte in the computer word, the set of bit positions each having a value set as a predetermined value, e.g. 1, to represent a presence of a data component related to the rule in the computer word corresponding to the set of reference bit positions can be determined based on a byte count value and the reference bit positions.

In this example, among the 255 mappings, only in one case, i.e. when all the bits are set values in the rule representation, the last byte in the result byte array will be 0X8 instead of 0X0. In order to eliminate time required for checking the value in the result byte array, the last byte in each result byte array is used as a loop counter which substantially improves the performance of the method for extracting rule specific data without creating any problem because when the last byte in the result byte array contains 0X8, the value of the loop counter is also 0X8.

In this example, four result byte arrays related to the rule can be identified based on the four non-zero decimal values 1, 2, 27 and 20.

As highlighted in FIG. 2(*c*), the result byte array corresponding to the first non-zero decimal value 1 calculated based on the first byte of the rule representation shown in FIG. 1(*b*) is {0X1, 0X0, 0X0, 0X0, 0X0, 0X0, 0X0, 0X1}, the last byte of the result byte array indicates that there is only one reference bit position 1 in the result byte array;

the result byte array corresponding to the second non-zero decimal value 2 calculated based on the second byte of the rule representation shown in FIG. 2(*b*) is {0X2, 0X0, 0X0, 0X0, 0X0, 0X0, 0X0, 0X1}, the last byte of the result array indicates that there is only one reference bit position 2 in the result byte array;

the result byte array corresponding to the third non-zero decimal value 27 calculated based on the third byte of the rule representation shown in FIG. 2(*b*) is {0X1, 0X2, 0X4, 0X5, 0X0, 0X0, 0X0, 0X4}, the last byte of the result array indicates that there are four reference bit positions, which are respectively 1, 2, 4 and 5 in the result byte array;

the result byte array corresponding to the fourth non-zero decimal value 20 calculated based on the first byte of the rule representation shown in FIG. 2(*b*) is {0X3, 0X5, 0X0, 0X0, 0X0, 0X0, 0X0, 0X2}, the last byte of the result array indicates that there are two reference bit positions, which are respectively 3 and 5 in the result byte array.

In block 203, based on each of the four identified result byte arrays, i.e. the set of reference bit positions indicated by each of the four identified result byte array and the last byte of each of the four identified result byte array which is used as a loop counter, the processor in the computer system determines a set of bit positions in the computer word in which a set of data components related to the rule are stored.

One set of bit positions in the computer word can be identified based on one result byte array. If the result byte array is identified based on the decimal value of a byte in the rule representation with a byte count value M (M=1), i.e. the 1st byte of the rule representation, i.e. the result byte array corresponding to the first byte of the rule representation, the set of bit positions in the computer word are the reference bit positions indicated by the result byte array;

if the result byte array N (N>1) is identified based on the decimal value of a byte in the rule representation with a byte count value M (M>1), i.e. the $M^{th}$ byte in the rule representation, e.g. $2^{nd}$-$8^{th}$ byte of the rule representation, each bit position P in the set of bit positions in the computer word in which a data component related to the rule is stored can be determined based on the corresponding reference bit position indicated by the result byte array N and the byte count value M associated with the byte in the rule representation. Specifically, each bit position in the set of bit positions can be determined based on the equation (1) below:

$$P=X+8(M-1) \tag{1}$$

Wherein P is the corresponding bit position in the computer word, X is the corresponding reference bit position shown in the result byte array N; M is the byte count value associated with the byte in the rule representation corresponding to the result byte array N.

According to the first result byte array {0X1, 0X0, 0X0, 0X0, 0X0, 0X0, 0X0, 0X1}, the reference bit position is 1, therefore the corresponding bit position in the computer word in which a data component related to the rule is stored is 1+8(1−1)=1, since the first result byte array corresponds to the first byte of the rule representation. Therefore, the 1$^{st}$ bit position in the computer word stores a data component related to the rule.

According to the second result byte array {0X2, 0X0, 0X0, 0X0, 0X0, 0X0, 0X0, 0X1}, the reference bit position is 2, therefore the corresponding bit position in the computer word in which a data component related to the rule is stored is 2+8(2−1)=10, since the second result byte array corresponds to the second byte of the rule representation. Therefore, the $10^{th}$ bit position in the computer word stores a data component related to the rule.

According to the third result byte array {0X1,0X2, 0X4, 0X5, 0X0, 0X0, 0X0, 0X4}, the reference bit positions include $1^{st}$ $2^{nd}$, $4^{th}$, $5^{th}$, therefore the corresponding bit positions in the computer word in which data components related to the rule are stored are respectively 1+8(3−1)=17, 2+8(3−1)=18, 4+8(3−1)=20, and 5+8(3−1)=21, since the third result byte array corresponds to the third byte of the rule representation. Therefore, the $17^{st}$, $18^{th}$, $20^{th}$, $21^{th}$ bit positions in the computer word store data components related to the rule.

According to the fourth result byte array {0X3, 0X5, 0X0, 0X0, 0X0, 0X0, 0X0, 0X2}, the reference bit positions include $3^{rd}$ and $5^{th}$, therefore the corresponding bit positions in the computer word in which data components related to the rule are stored are respectively 3+8(8−1)=59, 5+8(8−1)=61, since the fourth result byte array corresponds to the eighth byte of the rule representation. Therefore, the $59^{th}$, $61^{th}$ bit positions in the computer word store data components related to the rule.

The last byte in each identified result byte array is used as a loop counter when determining the set of bit positions in the computer word in which a set of data components related to the rule are stored. For example, when determining the bit positions in the computer word corresponding to the fourth result byte array, the last byte indicates that there are two bit positions in the computer word in which data components related to the rule are stored. Accordingly, once the two bit positions are identified based on the first two bytes in the fourth result byte array, the process will stop, the other result bytes in the fourth result byte array will not be performed. In other words, to eventually determine the set of bit positions each having a value set as a predetermined value, e.g. 1, to represent a presence of a data component related to the rule in the computer word, the computer system loops over the values in each result byte array to identify the first zero valued byte in the result byte array. This zero check overhead can be avoided by maintaining the loop counter in the last byte of each result byte array.

In the embodiment shown in FIG. 2, the process of calculating decimal values corresponding to the eight bytes of the rule representation may be performed in sequence or at least partially in parallel; the process of identifying the four result byte arrays may be performed in sequence or at least partially in parallel; and the process of extracting data components related to the rule based on the four result byte arrays may be performed in sequence or at least partially in parallel. However, it is to be appreciated by a person skilled in the art that the above-described embodiment is not used to limit the operation sequence of the method.

As will be appreciated from the above, embodiments of the invention provide an efficient method for extracting data components related to a rule from a computer word stored in a computer system by using a predetermined compact rule representation associated with the rule and a preset look-up table. The preset look-up table does not create any computational overhead during the process of extracting rule specific data from the computer word. The preset lookup table shown in FIG. 2(*c*) contains 255*8=2040 bytes, however, in other embodiments of the invention, this can be reduced to half if the predetermined rule representation associated with the rule is a multi-bit string array, each multi-bit string having 4 bit of binary codes.

Figure 4:
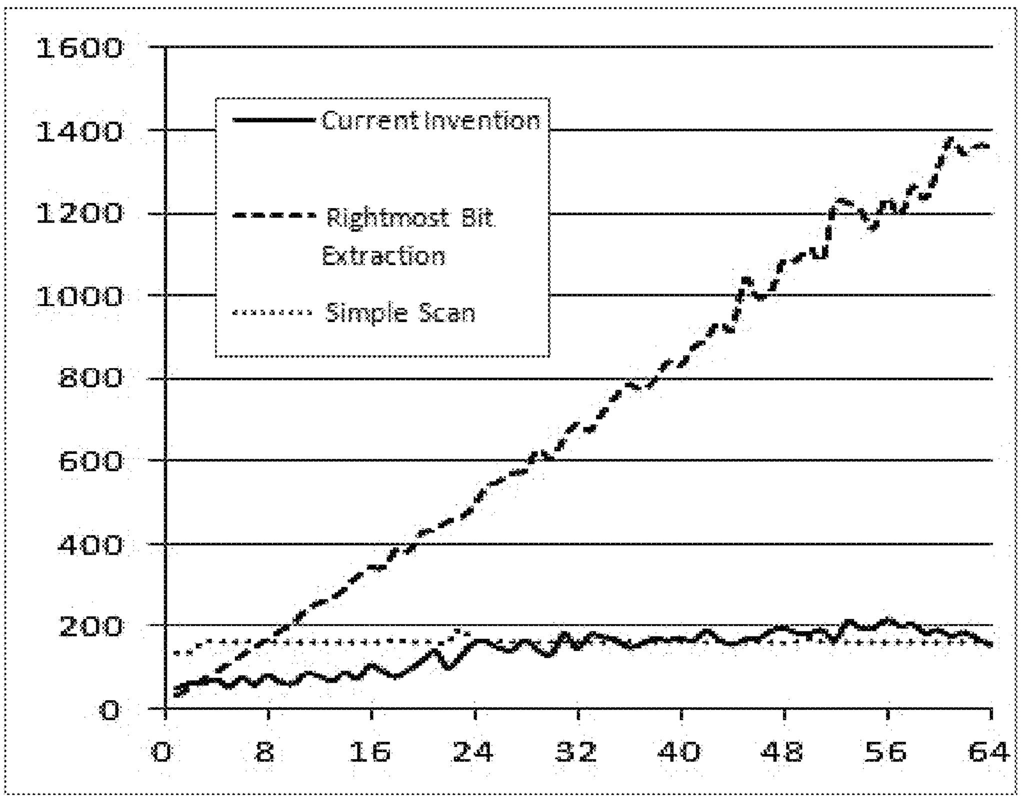
FIG. 4 shows graphs obtained based on the results in FIG. 2.
Figure 5:
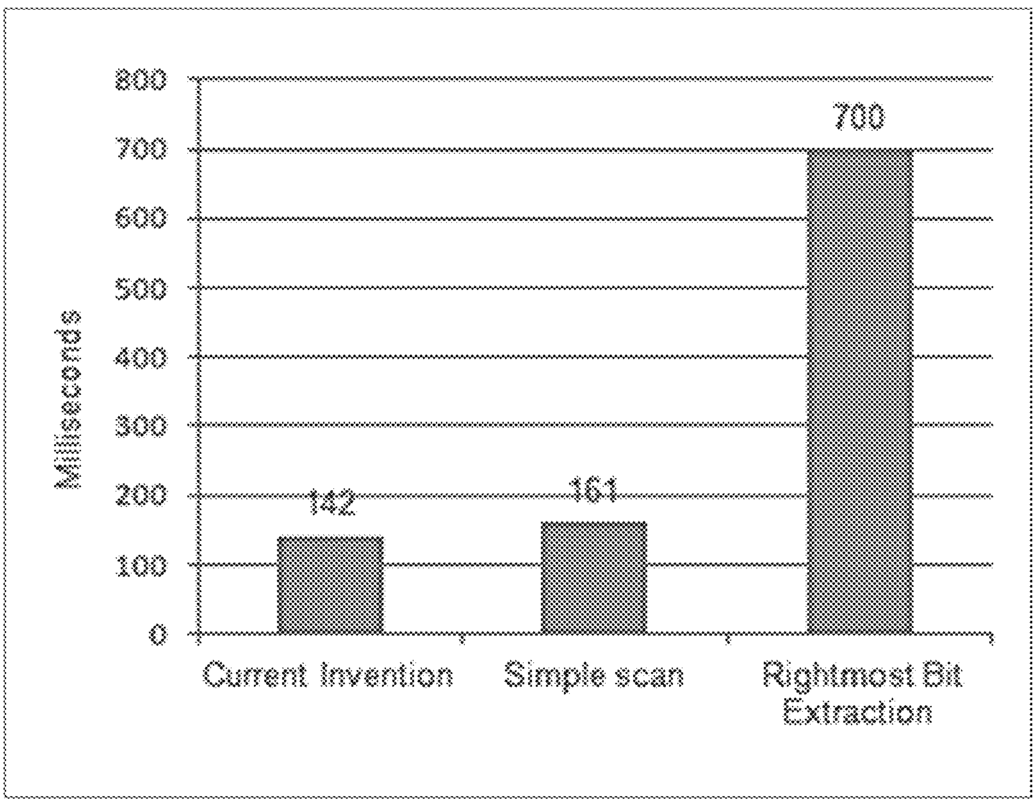
FIG. 5 is a bar chart showing the average time required for extracting different number of data components from a computer word respectively using the method disclosed in one embodiment of the invention, the existing simple scan method and rightmost bit extraction method.

To compare the performance of the method disclosed in one embodiment of the invention, with that of existing methods: the simple scan method and rightmost bit extraction method, the time required for extracting data components from 1 Million 64-bit computer words was calculated for 64 cases: the $i^{th}$ case has i number of bits set in random positions in 64-bit computer word; i varies from 1 to 64. The results obtained by running the test cases in a commodity machine with one Intel Pentium commodity grade dual core processor with 2 GHz clock speed using Java 1.6 VM are shown in the Table in FIG. 2, and graphs in FIG. 3 and FIG. 4.

From the analysis of results, it can be concluded that the method disclosed in the embodiment of the invention performs better than both existing methods for up to 23 set bits. Beyond 23 set bits, the results by using the method in one embodiment of the invention more or less match with the results of the simple scan method or slightly lag by few milliseconds. On the average, the method or system disclosed in the embodiment of the invention takes 19 milliseconds less than the existing simple scan method. In essence, the method in the embodiment of the invention is fastest up to 23 set bits; beyond 23 set bits it does not degrade drastically and provides results comparable to the existing simple scan method.

The embodiments of the invention provide a compact rule representation for each rule. Compactness of the rule representation allows the rule representation to be shared with other programs in a standard and efficient way.

The embodiments of the invention provide a fast method to extract rule specific date from a computer word. It takes almost 2KB extra space for table maintenance. However, this space is shared by all rule types and hence imposes negligible overhead for modern day computers. The computation time does not increase linearly with number of set bits in contrast to the existing extracting rightmost bit method. The embodiments of the invention may be performed in parallel, i.e. individual bytes in the rule representation associated with a rule can be checked in parallel. The existing extracting rightmost bit method does not support parallelism. The existing simple scan method can be parallelized; however, additional unsigned right shifts and temporary variables are required.

It is to be understood that the embodiments and features described above should be considered exemplary and not restrictive. Many other embodiments will be apparent to those skilled in the art from consideration of the specification and practice of the invention.

The scope of the invention should, therefore, be determined with reference to the appended claims, along with the full scope of equivalents to which such claims are entitled. Furthermore, certain terminology has been used for the purposes of descriptive clarity, and not to limit the disclosed embodiments of the invention.

The invention claimed is:

1. A method for extracting rule specific data from a computer word by a computer system, the method comprising:

calculating, by a processor in the computer system, at least one decimal value based on a rule representation associated with a rule, wherein the rule representation is a byte array including at least one byte binary codes, value of each bit of the byte array configured to represent whether a corresponding bit position in the computer word has a data component related to the rule;

identifying, by the processor in the computer system, at least one result byte array corresponding to the rule based on the calculated at least one decimal value from a preset look-up table in the computer system, wherein the preset look-up table includes a plurality of mappings, each mapping between a result byte array and a decimal value, the result byte array in each mapping indicating a set of reference bit positions for determining a set of bit positions in the computer word, wherein a last byte of the result byte array in each mapping is configured to represent a bit count value associated with the set of reference bit positions; and determining, by the processor in the computer system, a set of bit positions in the computer word in which a set of data components related to the rule are stored based on both the set of reference bit positions indicated by each identified result byte array and the last byte of each identified result byte array as a loop counter.

2. The method according to claim 1, wherein the computer word is a 64-bit word, the rule representation associated with the rule is an eight-byte array.

3. The method according to claim 2, wherein the step of calculating at least one decimal value comprises:

calculating, by the processor in the computer system, at most eight non-zero decimal values based on the rule representation associated with the rule;

wherein the step of identifying at least one result byte array comprises:

identifying, by the processor in the computer system, at most eight result arrays corresponding to the rule based on the calculated decimal values.

4. The method according to claim 1, wherein the computer word is a 32-bit word, the predetermined rule representation associated with the rule is a four-byte array.

5. The method according to claim 4, wherein the step of calculating at least one decimal value comprises:

calculating, by the processor in the computer system, at most four non-zero decimal values based on the rule representation associated with the rule;

wherein the step of identifying at least one result byte array comprises:

identifying, by the processor in the computer system, at most four result byte arrays corresponding to the rule based on the calculated decimal values.

6. The method according to claim 1, wherein the step of determining a set of bit positions in the computer word in which a set of data components related to the rule are stored further comprises:

if the identified result byte array does not correspond to a first byte in the rule representation, determining, by the processor in the computer system, the set of bit positions in which a set of data components related to the rule are stored based on both the set of reference bit positions indicated by the identified result byte array and a byte count value associated with the byte in the rule representation corresponding to the identified result byte array.

7. The method according to claim 1, wherein the step of calculating at least one decimal value, comprises:

calculating, by the processor in the computer system, each of more than one decimal value based on a corresponding byte of the rule representation in sequence;

wherein the result byte arrays corresponding to the rule are identified based on the calculated decimal values in sequence or in parallel.

8. The method according to claim 1, wherein the step of calculating at least one decimal value, comprises:

calculating, by the processor in the computer system, more than one decimal value, wherein at least some of the more than one decimal value are calculated in parallel;

wherein the result byte arrays corresponding to the rule are identified based on the calculated decimal values in sequence or in parallel.

9. The method according to claim 1, wherein the computer word is an 8-bit word, the predetermined rule representation associated with the rule is a one-byte array.

10. The method according to claim 9, wherein the step of calculating at least one decimal value comprises:

calculating, by the processor in the computer system, one decimal value based on the rule representation associated with the rule;

wherein the step of identifying at least one result byte array comprises:

identifying, by the processor in the computer system, one result byte array corresponding to the rule based on the calculated decimal value.

11. A non-transitory computer readable medium comprising computer program code for extracting data component related to a rule from a computer word, wherein the computer program code, when executed, is configured to cause a processor in a computer system perform a method according to claim 1.

12. A system for extracting rule specific data from a computer word, the system comprising:

a processor and a memory communicably coupled thereto, wherein the memory is configured to store data to be executed by the processor, wherein the processor is configured to calculate at least one decimal value based on a rule representation associated with a rule, wherein the rule representation is a byte array including at least one byte binary codes, value of each bit of the byte array configured to represent whether a corresponding bit position in the computer word has a data component related to the rule;

identify at least one result byte array corresponding to the rule based on the calculated at least one decimal value from a preset look-up table stored in the memory, wherein the preset look-up table includes a plurality of mappings, each mapping between a result byte array and a decimal value, the result byte array in each mapping indicating a set of reference bit positions for determining a set of bit positions in the computer word, wherein a last byte of the result byte array in each mapping is configured to represent a bit count value associated with the set of reference bit positions; and determine a set of bit positions in the computer word in which a set of data components related to the rule are stored based on the set of reference bit positions indicated by each identified result byte array and by using the last byte of each identified result byte array as a loop counter.

13. The system according to claim 12, wherein the computer word is a 64-bit word, the rule representation associated with the rule is an eight-byte array.

14. The system according to claim 13, wherein the processor is further configured to calculate at most eight non-zero decimal values based on the rule representation associated with the rule; and identify at most eight result byte arrays corresponding to the rule based on the calculated decimal values.

15. The system according to claim 12, wherein the computer word is a 32-bit word, the predetermined rule representation associated with the rule is a four-byte array.

16. The system according to claim 15, wherein the processor is further configured to calculate at most four non-zero decimal values based on the rule representation associated with the rule; and identify at most four result byte arrays corresponding to the rule based on the calculated decimal values.

17. The system according claim 12, the processor is further configured to if the identified result byte array does not correspond to a first byte in the rule representation, determine the set of bit positions in which a set of data components related to the rule are stored based on both the set of reference bit positions indicated by the identified result byte array and a byte count value associated with the byte in the rule representation corresponding to the identified result byte array.

18. The system according to claim 12, wherein the processor is further configured to calculate each of more than one decimal value based on a corresponding byte of the rule representation in sequence; and identify the result byte arrays corresponding to the rule based on the calculated decimal values in sequence or in parallel.

19. The system according to claim 12, wherein the processor is further configured to calculate at least some of more than one decimal value in parallel; and identify the result byte arrays corresponding to the rule based on the calculated decimal values in sequence or in parallel.

20. The system according to claim 12, wherein the computer word is an 8-bit word, the predetermined rule representation associated with the rule is a one-byte array.

21. The method according to claim 20, wherein the processor is further configured to calculate one decimal value based on the predetermined rule representation associated with the rule, and identify one result byte array corresponding to the rule based on the calculated decimal value.

* * * * *